(12) United States Patent
De Santi (10) Patent No.: US 11,961,937 B2
(45) Date of Patent: Apr. 16, 2024

(54) APPARATUS FOR UNIFORMLY ARRANGING SOLAR CELL ELEMENTS, SYSTEM FOR USE IN THE MANUFACTURE OF SOLAR CELLS, AND METHOD FOR UNIFORMLY ARRANGING SOLAR CELL ELEMENTS

(71) Applicant: APPLIED MATERIALS ITALIA S.R.L., San Biagio di Callalta (IT)

(72) Inventor: Luigi De Santi, Spresiano (IT)

(73) Assignee: APPLIED MATERIALS ITALIA S.R.L., San Biagio di Callalta (IT)

(*) Notice: Subject to any disclaimer, the term of this patent is extended or adjusted under 35 U.S.C. 154(b) by 166 days.

(21) Appl. No.: 17/628,082

(22) PCT Filed: Aug. 13, 2019

(86) PCT No.: PCT/EP2019/071758
§ 371 (c)(1),
(2) Date: Jan. 18, 2022

(87) PCT Pub. No.: WO2021/028030
PCT Pub. Date: Feb. 18, 2021

(65) Prior Publication Data
US 2022/0262975 A1 Aug. 18, 2022

(51) Int. Cl.
*H01L 31/18* (2006.01)
*B65G 47/244* (2006.01)
(Continued)

(52) U.S. Cl.
CPC .......... *H01L 31/188* (2013.01); *B65G 47/244* (2013.01); *B65G 47/28* (2013.01); *B65G 47/907* (2013.01); *H01L 31/0516* (2013.01)

(58) Field of Classification Search
CPC ...... B65G 47/28; B65G 47/907; B65G 47/31; H01L 31/05; H01L 31/28; H01L 31/188; H01L 31/0516
(Continued)

(56) References Cited

U.S. PATENT DOCUMENTS 3,923,142 A * 12/1975 Rysti ...................... B65G 47/32
198/461.2
8,800,750 B2 * 8/2014 Buchberger ........... B65G 43/10
198/461.2
(Continued)

FOREIGN PATENT DOCUMENTS

EP 3316318 A1 5/2018
WO 2016090293 A1 6/2016
(Continued)

OTHER PUBLICATIONS

International Search Report and Written Opinion for Application No. PCT/EP2019/071758 dated Oct. 18, 2019.

*Primary Examiner* — James R Bidwell
(74) *Attorney, Agent, or Firm* — Patterson + Sheridan, LLP (57) ABSTRACT

An apparatus for uniformly arranging solar cell elements that includes: a transport device for moving at least one solar cell element at a first speed; a transfer device that includes at least one gripping unit configured to grip the at least one solar cell element; and an actuator configured to move the transfer device at a second speed that is higher than the first speed.

15 Claims, 4 Drawing Sheets

(51) Int. Cl.
  *B65G 47/28*    (2006.01)
  *B65G 47/90*    (2006.01)
  *H01L 31/05*    (2014.01)

(58) Field of Classification Search
  USPC ..................................................... 198/461.2
  See application file for complete search history.

(56) References Cited

U.S. PATENT DOCUMENTS

2013/0149075 A1*  6/2013  Shah ................. H01L 21/67736
                                                          414/217
2017/0323808 A1*  11/2017  Gislon ................ H01L 31/0504

FOREIGN PATENT DOCUMENTS

| WO | 2016090339 | A1 | | 6/2016 | |
|---|---|---|---|---|---|
| WO | 2018166598 | A1 | | 9/2018 | |
| WO | 2019/141362 | A1 | * | 8/2019 | ............. H01L 31/18 |

* cited by examiner

APPARATUS FOR UNIFORMLY ARRANGING SOLAR CELL ELEMENTS, SYSTEM FOR USE IN THE MANUFACTURE OF SOLAR CELLS, AND METHOD FOR UNIFORMLY ARRANGING SOLAR CELL ELEMENTS

TECHNICAL FIELD

Embodiments of the present disclosure relate to an apparatus for uniformly arranging solar cell elements, a system for use in the manufacture of solar cells and a method for uniformly arranging solar cell elements. Embodiments of the present disclosure particularly relate to an apparatus for uniformly arranging solar cell elements, the apparatus including a transfer device including at least one gripping unit configured to grip at least one solar cell element moving at a first speed, and an actuator configured to move the transfer device at a second speed that is higher than the first speed.

BACKGROUND

Solar cells are photovoltaic devices that convert sunlight directly into electrical power. A solar cell is a form of photoelectric cell, defined as a device having electrical characteristics, such as current, voltage, or resistance, that vary when exposed to light.

In the production of solar cells in large quantities, it is important to achieve high economic manufacturing efficiency to enable the end product to compete in a highly disputed and highly competitive market. A relevant aspect of manufacturing efficiency is the ability to produce high product quantities per unit of time without any loss in product quality. Accordingly, it would be beneficial to improve the production speed of solar cells while maintaining high quality standards.

SUMMARY

According to an aspect of the present disclosure, an apparatus for uniformly arranging two or more, especially three, five or more solar cell elements is provided. The apparatus includes a transfer device including at least one gripping unit configured to grip at least one solar cell element moving at a first speed, and an actuator configured to move the transfer device at a second speed that is higher than the first speed.

According to another aspect of the present disclosure, an apparatus for uniformly arranging solar cell elements is provided that includes: a transport device for moving at least one solar cell element at a first speed; a transfer device that includes at least one gripping unit configured to grip the at least one solar cell element; and an actuator configured to move the transfer device at a second speed that is higher than the first speed.

According to another aspect, an apparatus for transporting solar cell elements is provided that includes: a transport device for moving a first solar cell element from a first position to a second position and an actuator configured to move a transfer device. The transfer device is configured for moving a second solar cell element from the first position to the second position. The first solar cell and the second solar cell elements are moved at different speeds.

According to another aspect of the present disclosure, a system for use in the manufacture of solar cells is provided. The system includes the apparatus for uniformly arranging solar cell elements, a support device configured to provide the target area of the solar cell elements described herein, a cleaving station for cleaving a solar cell into a number of solar cell elements, and an arranging station for arranging at least two solar cell elements to partially overlap.

According to another aspect of the present disclosure, a method for uniformly arranging two or more, especially three, five or more solar cell elements is provided. The method includes:
moving at least one solar cell element at a first speed,
gripping the at least one solar cell element,
moving the at least one solar cell element at a second speed that is higher than the first speed.

The device, the system and the method of the present disclosure provide a concept for an improved manufacturing efficiency of solar cells, and allow for producing solar cells with higher production speed while maintaining high quality standards.

Further aspects, advantages and features of the present disclosure are apparent from the dependent claims, the description and the accompanying drawings.

BRIEF DESCRIPTION OF THE DRAWINGS

So that the manner in which the above recited features of the present disclosure can be understood in detail, a more particular description of the present disclosure, briefly summarized above, may be had by reference to typical embodiments. The accompanying drawings relate to embodiments of the present disclosure and are described in the following:

FIG. 1b shows a schematic top view of the apparatus of FIG. 1a;

DETAILED DESCRIPTION OF EMBODIMENTS

Reference will now be made in detail to the various embodiments of the present disclosure, one or more examples of which are illustrated in the figures. Within the following description of the drawings, the same reference numbers refer to the same components. Generally, only the differences with respect to individual embodiments are described. Each example is provided by way of explanation and is not meant as a limitation of the present disclosure. Features illustrated or described as part of one embodiment can be used on or in conjunction with other embodiments to yield yet a further embodiment. It is intended that the description includes such modifications and variations.

Figure 1A:
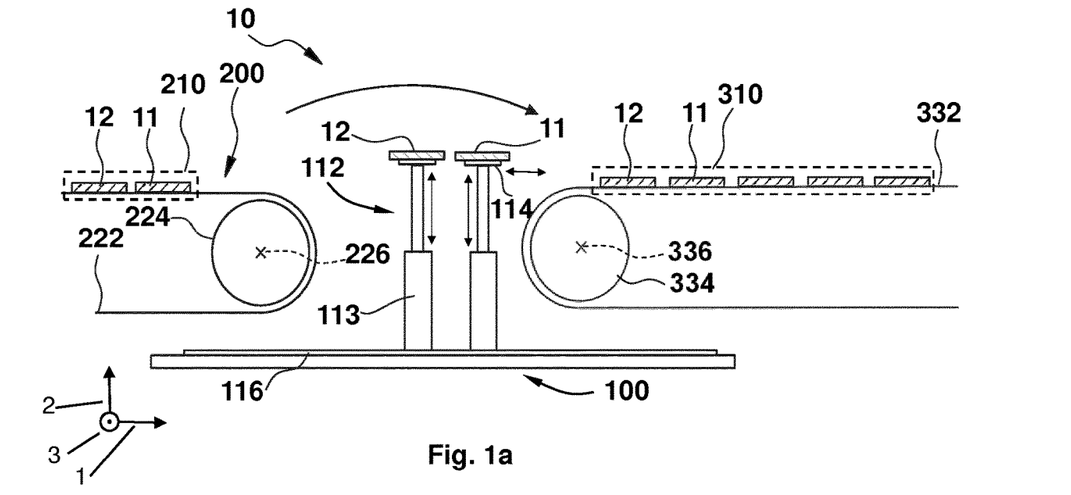
FIG. 1a shows a schematic side view of an apparatus for uniformly arranging solar cell elements according to embodiments described herein.

It is noted here that the terms first direction, second direction and third direction can be directions defining a cartesian coordinate system. Especially, the first and third directions can be horizontal directions, essentially perpendicular to each other and essentially parallel to a plane that is essentially perpendicular to a gravitational direction, and the second direction can be an essentially vertical direction, opposite to the gravitational direction. This is exemplarily visualized in FIG. 1a showing the two horizontal directions 1 and 3, and the vertical direction 2.

The term orientation can mean the alignment, direction or positioning of a characteristic, geometric or constructive feature of the solar cell element, such as a longitudinal axis, a transverse axis or a labelled corner. A changed or unchanged orientation of the solar cell element is evaluated by reference to a benchmark such as an initial orientation of the solar cell element or the first, second or third direction.

Further, if a solar cell is cleaved or split into several parts, for example six parts, the pieces obtained after the cleaving are referred to as "solar cell elements". The solar cell arrangements of the present disclosure can be uniformly arranged solar cell elements that can be further used for making partially overlapping solar cell elements that can be used in solar cell modules, in particular for shingled solar cell arrangements.

The term pseudo-square can refer to a shape based on a square shape with rounded or cut corners. Similarly, a pseudo-rectangular shape can refer to a shape based on a rectangular shape in which two adjacent corners are rounded or cut. When cutting a pseudo-square solar cell into several solar cell elements, in particular with the same width, the obtained intermediate solar cell elements each have a rectangular shape and the end pieces each have a pseudo-rectangular shape. End pieces obtained by cutting a pseudo-square solar cell have opposite orientations, the rounded corners of the respective end pieces facing in opposite directions.

Figure 1B:
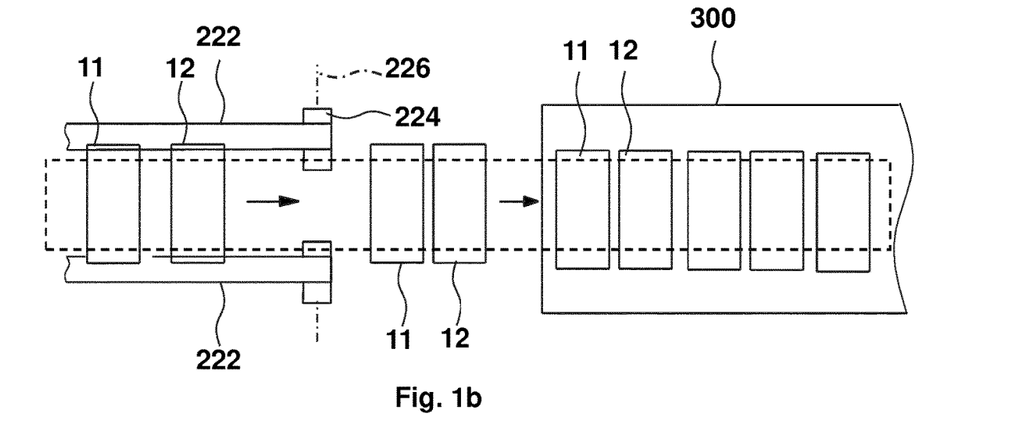

FIG. 1a shows a schematic side view of an apparatus 10 for uniformly arranging at least two solar cell elements, and FIG. 1b shows a schematic top view of the apparatus 10 of FIG. 1a. Details explained with illustrative reference to FIG. 1a or FIG. 1b shall not be understood as limited to the elements of FIG. 1a or FIG. 1b. Rather, those details may also be combined with further embodiments explained with illustrative reference to the other figures.

According to embodiments described herein, the apparatus 10 for uniformly arranging at least two solar cell elements may include a transfer device 100 and an actuator 116 hereinafter referred to as first actuator. The transfer device 100 may include at least one gripping unit 112. The gripping unit 112 may be configured to grip at least one solar cell element 11, 12 moving at a first speed. The first actuator 116 may be configured for moving the transfer device 100 at a second speed that is higher than the first speed. In the illustrated embodiment, the gripping unit is adapted to grip the solar cell elements from below.

However, generally and not limited to any embodiment, the gripping unit is adapted to grip the solar cell elements from above. In addition, the transport device may be adapted to support the solar cell elements from below.

The actuator can be configured to move the transfer device at the first speed before the at least one gripping unit grips the at least one solar cell element and to accelerate to the second speed after the at least one gripping unit grips the at least one solar cell element.

Apparatus 10 may be configured to perform one or more of the following: i) the first actuator 116 moves the transfer device 100 next to the at least one solar cell element 11,12 moving at the first speed, ii) the at least one solar cell element 11,12 located in an initial area 210 is gripped, in particular lifted, by the at least one gripping device 116, iii) the first actuator 116 accelerates the transfer device 100 to the second speed which is higher than the first speed, to transport the at least one lifted solar cell element 11,12 to a target area 310, and iv) the at least one solar cell element 11,12 is deposited in the target area 310.

The initial area can be part of a transport device and the target area can be part of a support device.

The initial area can be a support region of the transport device. The support region of the transport device can be configured to support the at least one solar cell element before moving from the transport device to the support device. In other words, the initial area can be located on the support region of the transport device on which the at least one solar cell element is or can be arranged before moving from the transport device to the support device. In other embodiments, the support device is part of the transport device.

The target area can be a support region of the support device. The support region of the support device can be configured to support at least one solar cell element after moving from the transport device to the support device, especially after being placed on the support device. In other words, the target area can be located on the support region of the support device on which the at least one solar cell element is or can be arranged after moving from the transport device to the support device.

According to embodiments described herein, the transport device may be configured to move at least two solar cell elements at the first speed. The transfer device may include at least two gripping units particularly adjacently arranged, especially displaceable relative to each other. The gripping units may be configured i) to grip the at least two solar cell elements, and/or ii) to move the gripping units relative to each other.

According to embodiments described herein, the apparatus can be configured to place the at least two solar cell elements in the target area at a predetermined distance from each other, in particular not overlapping, or to uniformly arrange the at least two solar cell elements in relation to at least one solar cell element present in the target area. In particular, the at least two solar cell elements may be positioned in an overlapping manner in the target area. The overlap may be below 5 mm or even below 2 mm.

If at least one solar cell element is present in the target area 310, the apparatus 10 can be configured to arrange the moved at least two solar cell elements 11,12 in alignment with the solar cell element or elements already present in the target area 310. In other words, the moved solar cell element 11, 12 can be placed or arranged in the target area for substantially equal distances between the solar cell elements in the target area. The same applies when moving two or more elements; the moved solar cell elements 11,12 can be arranged in the target area 310 for substantially equal distances between the solar cell elements in the target area. Substantially equal distances between the solar cell elements can mean that the solar cell elements are substantially uniformly spaced. Substantially uniformly spacing solar cell elements may imply that the solar cell elements 11,12 moved from the initial area 210 into the target area 310 are spaced from each other or aligned with each other during movement, just as the solar cell elements in the target area 310 are spaced or aligned.

The design of the apparatus 10 allows the solar cell elements 11,12 to be transported to the target area 310 faster and/or in a shorter time, since being moved at the second speed which is higher than the first speed. In addition, the uniform arrangement of the solar cell elements 11,12 in the target area 310 makes further processing of the solar cell elements 11,12, e.g. subsequent producing of shingled cells arrangements, easier and faster. In further processing of the solar cell elements, there are no idle times due to solar cell elements that are not regularly or not evenly arranged.

The transport device typically transports at least one solar cell element along a transport route of the transport device. The transfer device typically transfers at least one solar cell element along a transport route of the transfer device. According to embodiments, the transport device and the transfer device are configured to transport the at least one solar cell element at least partly over the same transport route. This is also illustrated in the figures, see particularly FIG. 1c wherein the transport route of the transport device is from left to right, and where the transfer device is configured to transport the solar cell elements along the same way, i.e., along the same transport route.

In particular, "same transport route" for a movement between a first position and a second position includes a situation where the first position and the second position is part of both the transport route of the transport device and the transport route of the transfer device. The term "same transport route" shall typically also includes detours of the transfer device or the transport device. As understood herein, the transport route is typically understood as in which direction the at least one solar cell element is moved forward. The height of the at least one solar cell elements is typically not taken into account when describing the transport route.

Overall, the design allows to save production time compared to existing production equipment i) that carries out the operation of moving the solar cell elements from an initial area of the transport device to a target area of the support device at the first speed, and/or ii) that does not uniformly arrange the solar cell elements 11,12 in the target area. This enables an improved manufacturing efficiency of solar cells, and allows for producing solar cells with higher production speed while maintaining high quality standards.

In particular, the present disclosure provides a controller that selects solar cell elements whose movement shall be accelerated. For instance, the transport device may be moving at a first speed v1 and be carrying a number of solar cell elements. Depending on the application and control, some of the number of solar elements might be chosen to be "pushed forward" by transferring them with the transfer device at a speed v2>v1. After the transfer device has completed the transfer, the solar cell elements may be put back on the transport device where they normally move with the speed of v1 again. Yet, this is beneficial as they advance more than those solar cell elements staying on the transport device and moving constantly with the speed v1.

The two-speed design of the apparatus 10 may allow the transport device 200 to function as a buffer or interim storage for the solar cell elements. The buffering function may be related to the following:

i) before entering the buffer, the solar cell elements can be disordered; in particular, the solar cell elements can have unequal distances and/or unequal orientations with respect to each other. In contrast, the solar cell elements exiting the buffer can be ordered, in particular can have equal distances and equal orientations with respect to each other.

ii) before entering the buffer, operations on the solar cell elements can be performed faster than the operation of lifting the solar cell elements from the conveyor belt exiting the buffer.

iii) before entering the buffer, the solar cell elements can be transported on a conveyor belt that is longer, especially by a factor of 1.3, 1.7, 2 or 4, than the conveyor belt on which the solar cell elements are transported after exiting the buffer.

According to embodiments described herein, the transfer device 100 can include at least two gripping units 112 especially configured to move relative to each other, wherein especially the gripping units 112 can be arranged next to each other and can be moved relative to each other.

The at least one gripping unit may be configured i) to releasably grip the at least one solar cell element 11,12 from the underside and/or ii) to lift the at least one solar cell element. In general, the gripping as such may include lifting, especially from the underside of the gripped element.

The transfer device such as the gripping unit may be configured to reach through the transport device. For instance, the transport device may include two conveyor belts arranged in parallel with, for example, a conveyor belt width of less than 5 cm. The transfer device may be configured to grip the solar cell elements that rest on the transport device and lift them off the transport device. This is also exemplarily illustrated in FIG. 1c.

The gripping units may be configured to grip at least one solar cell element less than the solar cell elements moved by the transport device, the transport device being configured to further transport at least one solar cell element to the support device.

According to embodiments described herein, the apparatus 10 may include a second actuator 118 for moving the at least two gripping units 112 relative to each other, in particular separately and/or independently from each other. The apparatus 10 may have a second actuator for each gripper unit 112; thus, the term "second actuator" can be understood as a generic term for actuators of the individual gripper units 118 configured each to move the gripping units 112 relative to each other.

The first actuator 116 may include at least one drive designed to, in particular translationally, move the transfer device 100. The second actuator 118 may include at least one drive designed to, in particular translationally, move the at least two gripping units 112. Each of the drives may be configured as a linear drive, in particular a linear motor as understood by the skilled person. Each drive may be configured to directly move or translate the transfer device 100 or the at least one gripping unit 112, especially in a horizontal plane. Especially, the first actuator 116 may include rails, to which the gripping units 112 are movably attached, each of the drives being coupled to a gripping unit 112 to move the gripping unit 112 along the corresponding rail, especially in the horizontal plane, particularly relative to each other.

Moving may include translatorily moving the solar cell elements 11, 12 from the initial area 210 of the transport device 200 to a target area 310 of the support device 300. The distance between the solar cell elements 11, 12 may remain basically unchanged during moving, if the distance equals a distance between solar cell elements already present in the target area 310. Alternatively, the distance between the solar cell elements 11, 12 may be adapted during moving, if the distance differs from the distance between solar cell elements already present in the target area 310.

Moving the at least two solar cell elements may include i) picking up each of the solar cell elements 11, 12 from an initial position of each solar cell element 11, 12,
ii) lifting up each of the solar cell elements 11, 12,
iii) translating each of the solar cell elements 11, 12 from an initial area 210 of the transport device 200 to a target area 310 of the support device 300, and
iv) releasing each of the solar cell elements 11, 12 at a final position of each solar cell element 11, 12.

During movement from the initial area 210 to the target area 310, the solar cell elements 11,12 can be aligned with respect to each other. Aligning may include i) moving the solar cell elements 11, 12 relative to each other, for example by adapting the distance between the solar cell elements 11, 12, and if necessary ii) rotating at least one of the solar cell elements 11, 12 about a vertical axis, in particular by 180°. Rotating can especially be performed to achieve similar, in particular identical, orientation of the solar cell elements 11, 12.

The initial position can be provided when a solar cell element rests on the transport device 200, for example, on the one or more belts 222. The target position can be provided when a solar cell element rests on the support device 300.

The apparatus 10 can be designed to simultaneously move and align more than two solar cell elements 11, 12, in particular three, four, five or more solar cell elements 11, 12.

According to embodiments described herein, the transfer device 100 may include at least two, especially three, four, or at least five, adjacently arranged gripping units 112 that are movable relative to each other. Each of the gripping units 112 can be configured to releasably grip a solar cell element or any of the solar cell elements 11, 12. Further, the transfer device 100 may be configured to move the gripping units 112 from the transport device 200 to the support device 300 and/or to move the gripping units 112 towards each other. This achieves the effect of allowing to adapt the distances between irregularly spaced solar cell elements 11,12 that are moving from the initial area 210 to the target area 310 to the distances between solar cell elements that are already present in the target area 310.

According to embodiments described herein, the transfer device 100 may be configured to change an orientation of a solar cell element when moving the solar cell element from an initial position of the solar cell element to a target position of the solar cell element, especially by changing the orientation of a gripping unit 112 or of any of the gripping units 112, which may be performed for example by rotating any of the gripping units 112. This achieves the effect of enabling end pieces, i.e. pseudo-rectangular solar cell elements 27, with opposite orientation to be arranged in such a way that they have the same orientation.

According to embodiments described herein, the first actuator 116 may be configured to move the transfer device 100 and/or the gripping units 112 in a translational movement. The gripping units 112 may be moved independently of each other. The first actuator 116 may include a drive or several drives designed to perform the translational movement of the gripping units 112. Each of the drives may be configured as a linear drive, in particular a linear motor as understood by the skilled person, configured to directly move or translate at least one gripping unit 112, especially in a horizontal plane. Alternatively, the first actuator 116 may include rails along which the gripping units 112 may move, each of the drives being coupled to a gripping unit 112 to move the gripping unit 112 along the corresponding rail, especially in the horizontal plane.

According to embodiments described herein, a gripping unit 112 or each gripping unit 112 may be configured to move a solar cell element from the initial position to the target position by lifting the solar cell element from the transport device 200, especially by transporting the solar cell element to the support device 300, and particularly by releasing the solar cell element on the support device 300. In other words, each gripping unit may be configured to move a solar cell element from an initial position to a target position by lifting up the solar cell element from the initial area, especially transporting the solar cell element to the target area, and particularly releasing the solar cell element at the target area.

To implement this functionality, each gripping unit 112 may include a gripping handle 113 and a gripping head 114 arranged at one end of the gripping handle 113. The gripping handle 113 may be designed as a telescopic device including mutually rotatable and extendable tubes which are inserted into each other, the handle 113 being configured to move or displace the gripping head 114 along the second direction 2, especially by a drive, e.g. a linear drive. The gripping head 114 may be configured to releasably grip a solar cell element, especially by an electrostatic, electrodynamic and/or mechanical force. Further, each gripping unit 112 may be configured to rotate the corresponding gripping head 114 about a longitudinal axis of the gripping handle 113 and/or gripping unit 112. The rotation can be carried out by rotating one of the tubes of the telescopic device, for example by a rotation drive.

According to embodiments described herein, a gripping head 114 or each gripping head 114 can be selected from the group consisting of: a mechanical gripper, a pneumatic gripper, an electrostatic gripper, an electrodynamic gripper, a vacuum gripper, and any combination thereof. As an example, one or each of the gripping heads 114 can be designed as a suction cup configured to provide an underpressure at a surface of the solar cell element to hold the solar cell element at the gripping head 114. The mechanical gripper can use mechanical devices, such as clamps, to hold the solar cell element at the gripping head 114. The electrostatic gripper and electrodynamic gripper can use an electrostatic force and an electrodynamic force, respectively, to hold the solar cell element at the gripping head 114.

According to embodiments described herein, the transfer device 100, particularly one or more of the gripping units 112, can be tiltable, for example, with respect to the first direction 1 and/or a horizontal plane. As an example, the transfer device 100 can tilt a first solar cell element 11 held by the transfer device 100 to align the first solar cell element 11 with respect to a second solar cell element 12 held by the transfer device 100. In particular, the front side or back side plane of the first solar cell element 11 can be oriented to be substantially parallel to a front side or back side plane, respectively, of the second solar cell element 12.

According to embodiments described herein, the apparatus 10 may include at least one detection device configured to detect a position of each solar cell element. The detection device may detect the time-dependent position during movement of the solar cell element from the initial position to the target position and to generate a detection signal depending on the time-dependent position of each solar cell element. The detection device may be configured to detect at least one characteristic structural, optical or electrical feature, especially at least one of one or more edges or corners, of each solar cell element and/or printing features on the solar cell element to detect or determine the position of each solar cell element.

The detection device may include a scanner, a camera, a laser, a laser scanner and/or at least one light source device. The light source device may include at least one light source, possibly arranged in direct line of sight to the camera, wherein the light source is selected from the group consisting of lamps, light tapes, flash lights, light bars, and any combination thereof. The light source device may further include at least one light diffusion device, wherein the light diffusion device is arranged in direct line of sight to the camera, and is configured to direct or redirect light coming from the light source onto the light diffusion device onto the camera.

The detection device can be configured to detect a characterizing feature, e.g. at least one edge or corner, of a solar cell element to detect the time dependent position and/or orientation of the solar cell element. As an example, the detection device can be configured to detect the at least one edge or corner, or printing features on the solar cell element to determine at least a part of a contour or silhouette of the solar cell element to determine the time dependent position and/or orientation of the solar cell element. The printing features can be, for example, fingers, busbars and/or fiducials.

The at least one detection device can have a field of view. The at least one detection device can be positioned such that at least one solar cell element is within the field of view of the detection device when moving from an area of the transport device 200 to an area of the support device 300, and when aligning with at least one other solar cell element to overlap.

According to embodiments described herein, the apparatus 10 may include a controller configured to control the movement of the first and second actuator 116, 118 to move each solar cell element from the initial position of each solar cell element to the target position of each solar cell element based on the detection signal.

The figures include further components of the system for use in the manufacture of solar cells. The system may include:
- the apparatus 10 for uniformly arranging solar cell elements,
- the support device 300 configured to provide the target area of the solar cell elements,
- a cleaving station 500 for cleaving a solar cell into a number of solar cell elements; and/or
- an arranging station 400 for arranging at least two solar cell elements to partially overlap.

According to embodiments described herein, the transport device and the transfer device may both be configured to transport the at least one solar cell element over a same transport route; an especially common conveyor lane may comprise the transport route, i.e. the transport route may be part of the conveyor lane.

Figure 1C:
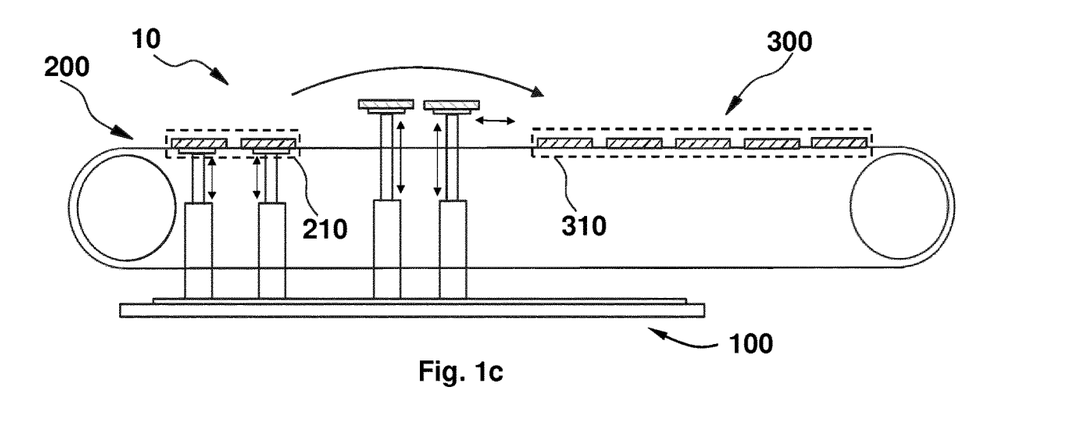
FIG. 1c shows a schematic side view of an apparatus for uniformly arranging solar cell elements according to embodiments described herein.

The apparatus 10 can be configured to move the solar cell elements from a first position on a conveyor belt to a second position on the same conveyor belt. While the conveyor belt moves with a first speed, the movement of solar cell elements from the first position to the second position can be performed also by the transfer device at the second speed, which is higher than the first speed, in particular higher than the speed of the conveyor belt. In this embodiment, the transport device and the support device can be implemented in a single device, for example in the form of a conveyor belt. This embodiment is shown in FIG. 1c.

According to embodiments described herein, the transport device and the transfer device may be configured to transport the at least one solar cell element over separate transport routes; separate conveyor lanes may each comprise a transport route.

The apparatus 10 can be configured to move the solar cell elements from a first position on a first conveyor belt to a second position on a second conveyor belt. The movement from the first position to the second position can be performed at the second speed, which is higher than the first speed, in particular higher than the speed of the conveyor first line. In this embodiment, the transport device and the support device can be implemented in different, separate devices. This embodiment is shown in FIG. 1a, 1b.

According to embodiments described herein, at least one of the transport device 200 and the support device 300 may be selected from the group consisting of a conveyor belt, a vacuum chuck, an electrostatic chuck, an electrodynamic chuck, and any combination thereof. One or more cameras of the detection device may be arranged below the transport device 200 and possibly below the support device 300. The transfer device 100 may be arranged above the transport device 200.

According to embodiments described herein, the transport device 200 can include, or be, a belt conveyor having a roller 224 rotatable around a rotational axis 226 and one or more belts 222 (also referred to as "pickup belt") provided on the roller 224. In some implementations, the transport device 200 can have two or more belts 222 arranged in parallel and spaced apart in the second direction 2, as it is shown in the top view of FIG. 1b. The gap(s) provided between the two or more belts 222 of the transport device 200 can allow the solar cell element 11, 12 to be detected by the detection device through the gap(s). The transport device 200 can be arranged at a position between the transfer device 100 and the detection device, and the transfer device 100 can be arranged between the transport device 200 and the support device 300.

According to embodiments described herein, the support device 300 may include, or be, at least one of an electrostatic or electrodynamic chuck and a vacuum chuck. The electrostatic or electrodynamic chuck can use an electrostatic or electrodynamic force, respectively, to hold the solar cell element or solar cell arrangement at the support surface. The vacuum chuck can include a support surface configured to support the solar cell element or at least one solar cell arrangement including the solar cell element, wherein the support surface can have at least one of holes and recesses connected to a suction device, such as a vacuum pump, in order to generate an under pressure in the holes and/or recesses to hold the solar cell element or solar cell arrangement at the support surface.

The belt conveyor of the support device 300 can include a roller 334 rotatable around a rotational axis 336 and one or more belts 332 provided on the roller 334. In some implementations, the support device 300 can have two or more belts 332 arranged in parallel, spaced apart in the second direction 2, and configured to support at least one solar cell arrangement. In other implementations, the support device 300 may have one single belt 332 on which the at least one solar cell arrangement, e.g. two or three solar cell arrangements, can be assembled in parallel.

According to embodiments described herein, an adhesive, such as an electrically conductive adhesive, can be provided to the upper side of each solar cell element to connect the solar cell elements 11 to each other. By using a subsequent device for producing shingled cells arrangements, adjacent elements can be overlapped on top of each other such that the solar cell elements 11, 12 can be electrically and mechanically connected to each other. According to some embodiments, the adhesive is an electrically conductive adhesive selected from the group consisting of solder, silver paste, and an electrically conductive silicone adhesive.

According to embodiments described herein, the system for use in the manufacture of solar cells may include a separation device that is configured to separate a solar cell into at least two, especially four or six solar cell elements. In particular, the separation device can create solar cell elements 23 starting from a standard quadratic or pseudo-square solar cell. The separation device may include, or is, a cleaving device configured to mechanically contact the solar cell to divide the solar cell. Within a production lane of the system, the separation device may be arranged before the transport device 200, so as to provide the solar cell elements 25, 26 obtained from a solar cell to the transport device 200.

According to embodiments described herein, the support device 300 can include, or be, a belt conveyor. The support device 300, e.g., the belt conveyor, may be configured to support, especially fix and particularly transport a solar cell element or a solar cell arrangement including the solar cell element. In particular, the support device 300 can be configured for transportation of the solar cell element or the solar cell arrangement including the solar cell element in a transport direction, which can be a substantially horizontal direction.

A movement of the support device 300 and a movement of the transfer device 100 can be synchronized with each other. Synchronization can be performed during the assembling of the solar cell arrangement on the support device 300. Additionally or alternatively, a movement of the transport device 200 and a movement of the support device 300 can be aligned with each other. Generally, movements of several conveyor belts can be aligned with each other. By aligned at least some of the movements, a continuous process flow for assembling of the solar cell arrangement can be provided.

FIG. 1c shows a schematic side view of an apparatus 10 for uniformly arranging at least two solar cell elements. Details explained with illustrative reference to FIG. 1c shall not be understood as limited to the elements of FIG. 1c. Rather, those details may also be combined with further embodiments explained with illustrative reference to the other figures.

According to embodiments described herein, the transport device 200 and the support device 300 may be implemented as a single device such as a conveyor. This embodiment is shown in FIG. 1c, wherein the transport device 200 and the support device 300 are implemented as one conveyor lane. Except for this, the embodiments of FIGS. 1a and 1c are basically the same.

Transport device 200 and support device 300 may be responsible for the same section of the conveyor belt. Thus, the transport device 200 and the support device 300 may complement each other in order to enable the movement of the elements conveyed by the transfer device 100 to be boosted.

Figure 2:
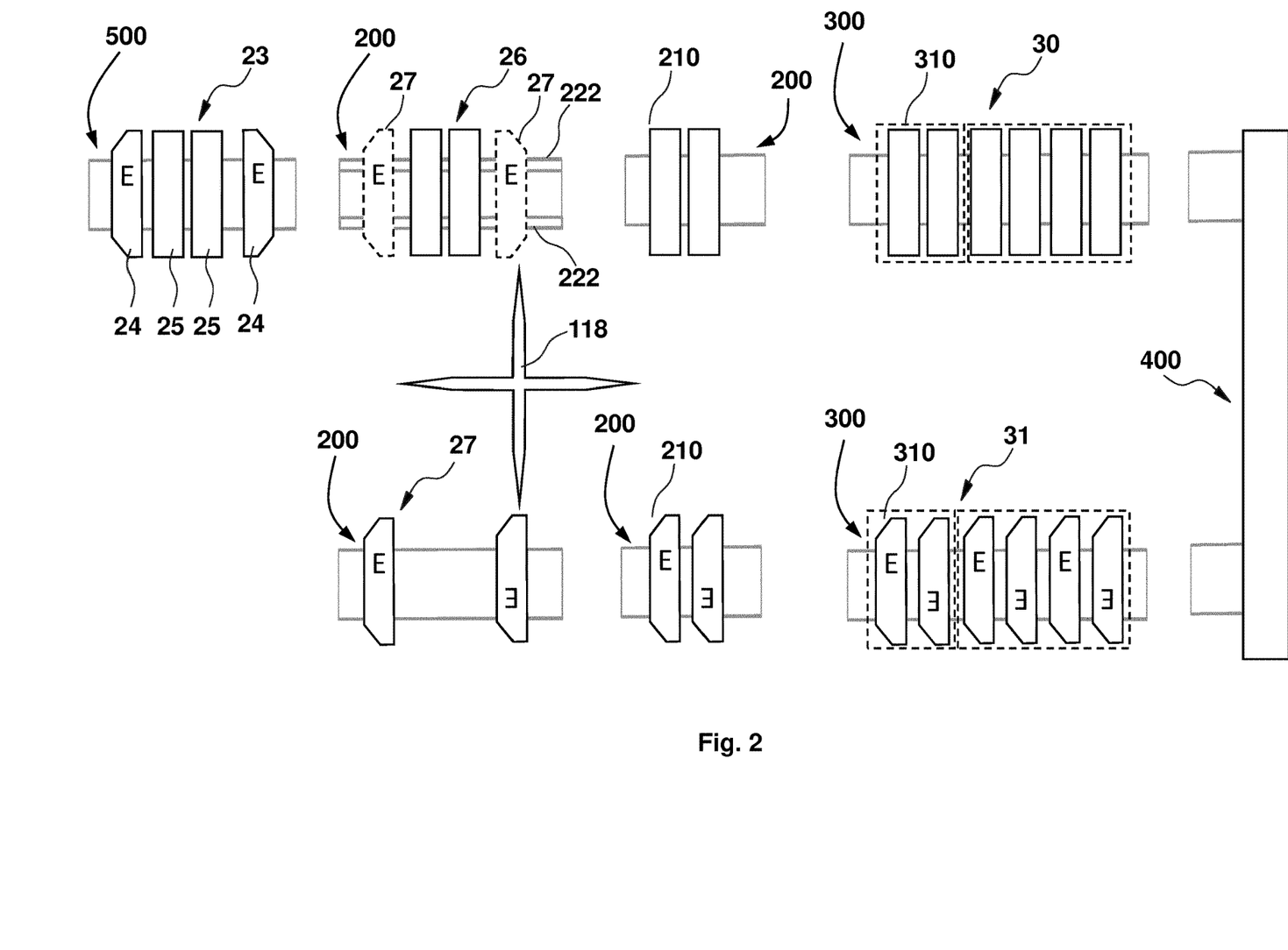
FIG. 2 shows a schematic top view of a system for use in the manufacture of solar cells according to embodiments described herein.

FIG. 2 shows a schematic top view of a system for use in the manufacture of solar cells. Details explained with illustrative reference to FIG. 2 shall not be understood as limited to the elements of FIG. 2. Rather, those details may also be combined with further embodiments explained with illustrative reference to the other figures.

According to embodiments described herein, the system for use in the manufacture of solar cells may include a transport device 200 configured for transporting solar cell elements 26, 27. Particularly, the system may further include a separating device 500 configured for separating a solar cell into several, e.g. four or six, solar cell elements 24, 25 and for delivering the obtained solar cell elements 24, 25 to the transport devices 200 (in the figure, the solar cell elements are depicted separated already). Especially, the system may further include an apparatus 10 for uniformly arranging at least two solar cell elements of which only a rotator 118 is shown in FIG. 2. Particularly, the system may further include a support device 300 configured to support, fix and transport the obtained solar cell arrangements 30, 31. Especially, the system may further include a device configured for further processing the solar cell arrangements 30, 31, e.g. a device for producing shingled cells arrangements 400.

A pseudo square solar cell entering the system is first conveyed to the separation device 500, in which a cleaving process may be applied to divide the solar cell into several, e.g. four or six, solar cell elements 25, 26. The solar cell elements 25, 26 obtained by the cleaving process include two end pieces 24 with pseudo rectangular shape and four rectangular intermediate solar cell elements 25.

According to embodiments described herein, the apparatus 10 for uniformly arranging at least two solar cell elements may include at least one rotator 118 configured i) to simultaneously move a solar cell element 11, 12 and especially ii) to change an orientation of the solar cell element 11, 12. The rotator 118 may include at least two, in particular four, laterally extended arms for moving the solar cell element 11, 12 along a circular arc around the rotator axis and especially for changing the orientation of the solar cell element 11, 12 when rotating the rotator 118 around the rotator axis. Each of the arms may have a gripping unit 112 for gripping a solar cell element 11, 12 at a distance from a rotator axis. The rotator axis may be substantially vertical to the solar cell element 11, 12 gripped or grippable by the gripping unit. The arc radius corresponds to the distance between the gripping unit 112 and the rotator axis. In addition, the gripping unit 112 can rotate around a gripper axis of rotation, thus independently and additionally changing the orientation of the solar cell element. The rotator 118 may be part of the first or of the second actuator.

The rotator 118 may perform, at least partially, the operation of simultaneously moving the first and the second solar cell elements 11, 12 from an area of the transport device 200 to an area of the support device 300 and the operation of aligning the first and the second solar cell elements 11, 12 to have the same orientation. That means, the rotator can be configured to arrange solar cell elements with different orientations, especially solar cell elements with opposite orientations, next to or behind each other in such a way that the solar cell elements have the same orientation. In particular, the rotator 118 may be configured to move pseudo rectangular solar cell elements from a first conveyor lane to a second conveyor lane. On the first conveyor lane, both rectangular and pseudo rectangular solar cell elements are arranged. On the second conveyor lane, that may be arranged parallel to the first conveyor lane, only pseudo rectangular solar cell elements having the same orientation are arranged.

According to embodiments described herein, a gripping unit 112 arranged at one of the rotator arms or at each of the rotator arms may be moved independently of a gripping unit 112 arranged at a another rotator arm. A gripping unit 112 arranged at one or at each of the rotator arms may be configured to move a solar cell element from the initial position to the target position by picking up the solar cell element from the transport device 200, transporting the solar cell element to the support device 300, and releasing the solar cell element on the support device 300.

To implement this functionality, a gripping unit 112 arranged at one or at each of the rotator arms may include a gripping handle 113 and especially a gripping head 114 arranged for example at one end of the gripping handle 113. The gripping handle 113 may be designed as a telescopic device including especially mutually rotatable and particularly extendable tubes. The tubes can be inserted into each other, wherein particularly the handle 113 is configured to move or displace the gripping head 114 along the second direction 2, especially by a drive, e.g. a linear drive. The gripping head 114 may be configured to releasably grip a solar cell element, especially by an electrostatic, electrodynamic and/or mechanical force. Further, each gripping unit 112 may be configured to rotate the corresponding gripping head 114 about a longitudinal axis of axis of the gripping handle 113 and/or gripping unit 112. The rotation, especially the rotation by 180°, can be carried out by rotating one of the tubes of the telescopic device, for example by a rotation drive or motor.

According to embodiments described herein, a gripping head 114 or each gripping head 114 of a gripping unit 112 arranged at one or at each of the rotator arms can be selected from the group consisting of: a mechanical gripper, a pneumatic gripper, an electrostatic gripper, an electrodynamic gripper, a vacuum gripper, and any combination thereof. As an example, one or each of the gripping heads 114 can be designed as a suction cup configured to provide an underpressure at a surface of the solar cell element to hold the solar cell element at the gripping head 114. The mechanical gripper can use mechanical devices, such as clamps, to hold the solar cell element at the gripping head 114. The electrostatic gripper and electrodynamic gripper can use an electrostatic force and/or an electrodynamic force, respectively, to hold the solar cell element at the gripping head 114.

The upper half of FIG. 2 shows a first conveyor lane at the exit of a separating device 500 designed to separate a pseudo square solar cell into four solar cell elements 24, 25 including two pseudo rectangular end pieces 24 and two intermediate rectangular solar cell elements 25. The intermediate solar cell elements 25 may be transferred by the first conveyor lane to a first transport device 200. Laterally arranged at the height of the transport device 200, the rotator 118 may be mounted. A second conveyor lane including a second transport device 200 may be arranged laterally next to the rotator 118. Each of the gripping units 112 mounted at each end of the four laterally extending rotator arms can grip one of the end pieces 24 of the solar cell. By turning the rotator 118 by 180° around the rotator axis, the gripped end piece 24 can be brought to the second conveyor lane and can be deposited there.

The term "lateral" may refer to a transverse position with respect to a longitudinal axis, especially to the axis of a conveyor lane. Alternatively or additionally, the term "lateral" can address a positional relation between a second point or object and a first point or object, wherein both points are located in a horizontal plane and spaced from each other. Especially, the first point can be an intersection of an axis, for example a rotation axis of rotator 118, with the horizontal plane.

In more general words, the present disclosure is particularly directed at a rotator configured to lift up a solar cell element, especially to rotate the solar cell element in the horizontal plane by e.g. 180°, and particularly to release the solar cell element displaced from the lift-up position. This may be useful in the production of shingled solar cells where the end pieces of pseudo square solar cells are separated from inner solar cell elements of the pseudo square solar cells. Such a rotator may be combined with all further aspects and details of embodiments described herein, and may be used even without the apparatus and method to uniformly arrange solar cell elements.

When an end piece is transferred by the rotator 118 from the first conveyor lane to the second conveyor lane, the orientation of the transferred end piece can change by 180°, especially if the gripping head 114 does not rotate about the gripper axis. However, it can be desired that all end pieces have the same orientation in the second conveyor lane. To achieve this, every second end piece may be rotated by 180° around the gripper axis by the corresponding gripping head 114 of the rotator 118 before being placed on the second conveyor lane. In the second conveyor lane, it can be seen in the lower half of FIG. 2 that the end pieces all have the same orientation and are separated by a distance which corresponds to the width of the four intermediate elements that remain in the first conveyor lane. To illustrate from which end of the solar cell an end piece deposited on the second conveyor lane originates, an "E" or an upside-down "E" is displayed.

In the further course of the first conveyor lane (above in FIG. 2) the solar cell elements 26 may be transferred in groups of two from the transport device 200 to the support device 300 by the transfer device 100 and uniformly arranged in solar cell arrangements as described above in the context of FIG. 1a, 1b, 1c. In the second conveyor lane (below in FIG. 2) the operation described for the first conveyor lane may be similarly performed. The solar cell arrangements 30, 31 obtained at the end of each of the first and second conveyor lanes may be transferred to a device 400 for producing shingled cells arrangements.

FIG. 3a-3d show side views of successive stages of processing with the apparatus 10 for uniformly arranging at least two solar cell elements in action. Details explained with illustrative reference to FIG. 3a-3d shall not be understood as limited to the elements of FIG. 3a-3d. Rather, those details may also be combined with further embodiments explained with illustrative reference to the other figures.

The operations shown in FIG. 3a-3d can be applied to the solar cell elements 26, 27 successively arranged at regular or irregular intervals on the transport devices 200 of both conveyor lanes shown in FIG. 2.

FIG. 3a-3d shows three solar cell elements 11, 12, 13 transported according to embodiments of the present disclosure. Two solar cell elements 11, 12 are conveyed with apparatus 10; a third solar cell element 13 remains on the conveyor belt 222 of the transport device 200. The solar cell element 13 remaining on the conveyor belt 222 is conveyed at the first speed to the supporting device 300. According to FIG. 3a-3d, conveyor belt 222 of transport device 200 is identical to conveyor belt 322 of supporting device 300.

Figure 3A:
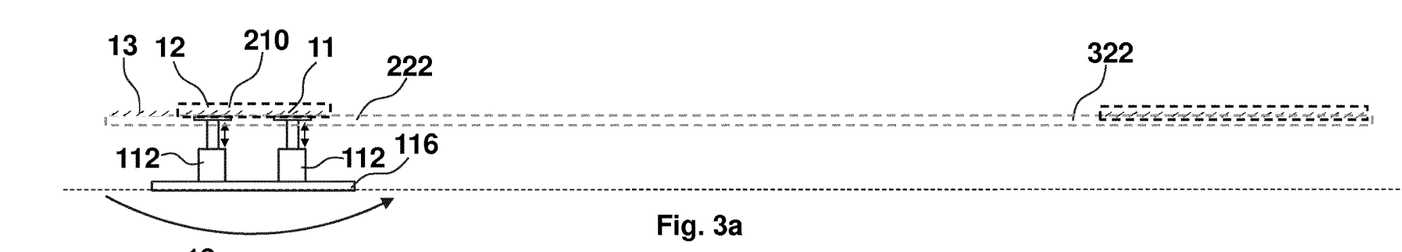
FIG. 3a-3d show side views of successive stages of processing with the apparatus for uniformly arranging solar cell elements in action according to embodiments described herein.

FIG. 3a shows an initial operation, at a first point in time: the solar cell elements 11, 12 can be arranged one behind the other or next to each other, spaced apart at a distance equal to the distance between the solar cell elements on the support device 300. The gripping units 112 of the transfer device 100 can be positioned below the solar cell elements 11, 12 so that each gripping unit 112 can grip and lift up a solar cell element. Particularly, the gripping units 112 do not grip or lift up the third solar cell element 13. The third solar cell element 13 may remain on the common conveyor belt 222, 322 of transport device 200 and support device 300.

Figure 3B:
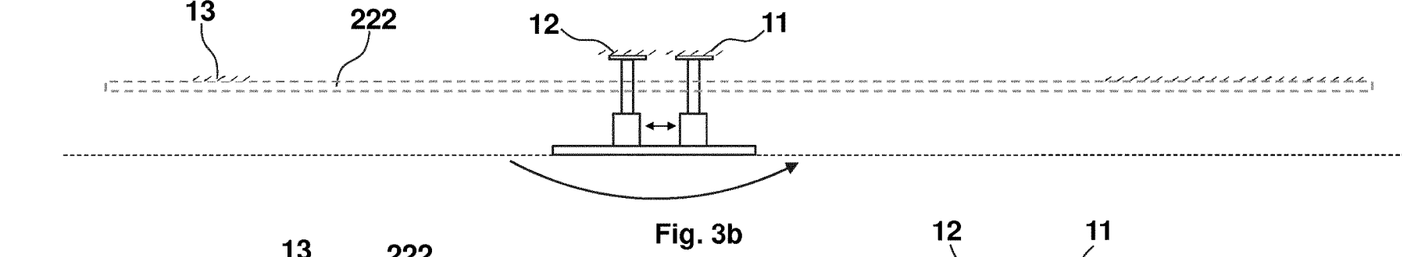

FIG. 3b shows an operation at a second point in time: the solar cell elements 11, 12 can be moved, especially simultaneously, from an initial area 210 on conveyor belt 222 to a target area 310 on conveyor belt 222. During the movement from transport device 200 to support device 300, before placing on the support device 300, the solar cell elements 11, 12 can be uniformly arranged. Uniformly arranging can be understood as arranging the solar cell elements 11, 12 at a distance that is equal to the distance between solar cell elements already present in the target area.

Between the first and the second point in time, the solar cell elements 11, 12 moved with the transfer device 100 can have progressed a considerable distance more than the third element 13 left on the conveyer belt 222. This illustrates the so-called movement boost for the transported solar cell elements which is related to the two-speed design of apparatus 10.

Figure 3C:
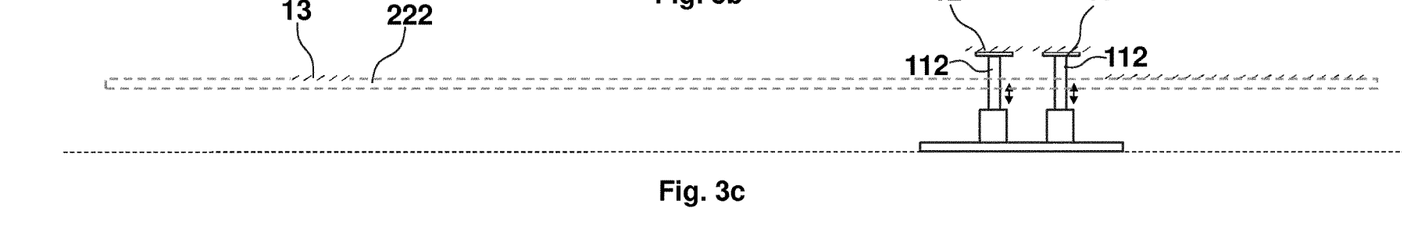
Figure 3D:
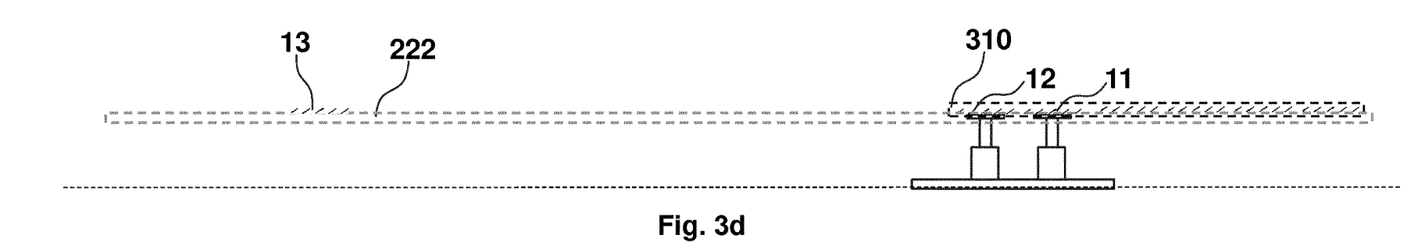

FIG. 3c, 3d show an operation at a third point in time: the solar cell elements 11, 12 can be moved to the respective target positions in the target area 310 and can be placed one next to the other to obtain a uniformly arranged solar cell arrangement. While solar cell elements 11, 12 are transported to the target area 310, the solar cell elements 11, 12 are also lowered onto the target area 310 of conveyor belt 222. The operations shown in FIG. 3c, 3d can be performed simultaneously; the simultaneity of the operations is indicated by the position of the third element 13 in FIG. 3d not having changed from FIG. 3c.

Uniform arrangement of the solar cell elements allows an advantageous shortening of process time for the subsequent processes. Further, the two-speed design of apparatus 10 allows to achieve a turbo effect for the transportation of solar cell elements; the turbo effect consists of closing gaps in the feed of solar cell elements.

Since, similar to the transport device 200, the support device 300 includes two conveyor belts separated from each other by a distance for conveying the solar cell elements 11, 12, moving and uniformly arranging of the elements shown in FIG. 3a-3d can be seamlessly carried out up to an area of the support device 300.

Figure 4A:
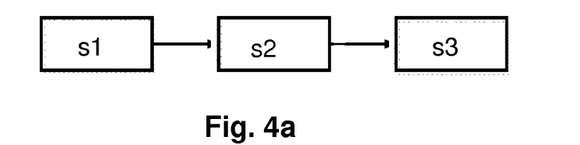
FIG. 4a shows a flowchart of a method for uniformly arranging solar cell elements according to embodiments described herein.

FIG. 4a shows a flowchart of a method for uniformly arranging solar cell elements according to embodiments described herein. Details explained with illustrative reference to FIG. 4a shall not be understood as limited to the actionactions or elements of FIG. 4a. Rather, those details may also be combined with further embodiments explained with illustrative reference to the other figures.

As shown in FIG. 4a, uniformly arranging solar cell elements may include the actionactions s1 to s3.

Action s1 may include moving at least one solar cell element 11,12 at a first speed;

Action s2 may include gripping the at least one solar cell element 11,12; and Action s3 may include moving the at least one solar cell element 11,12 at a second speed that is higher than the first speed.

Figure 4B:
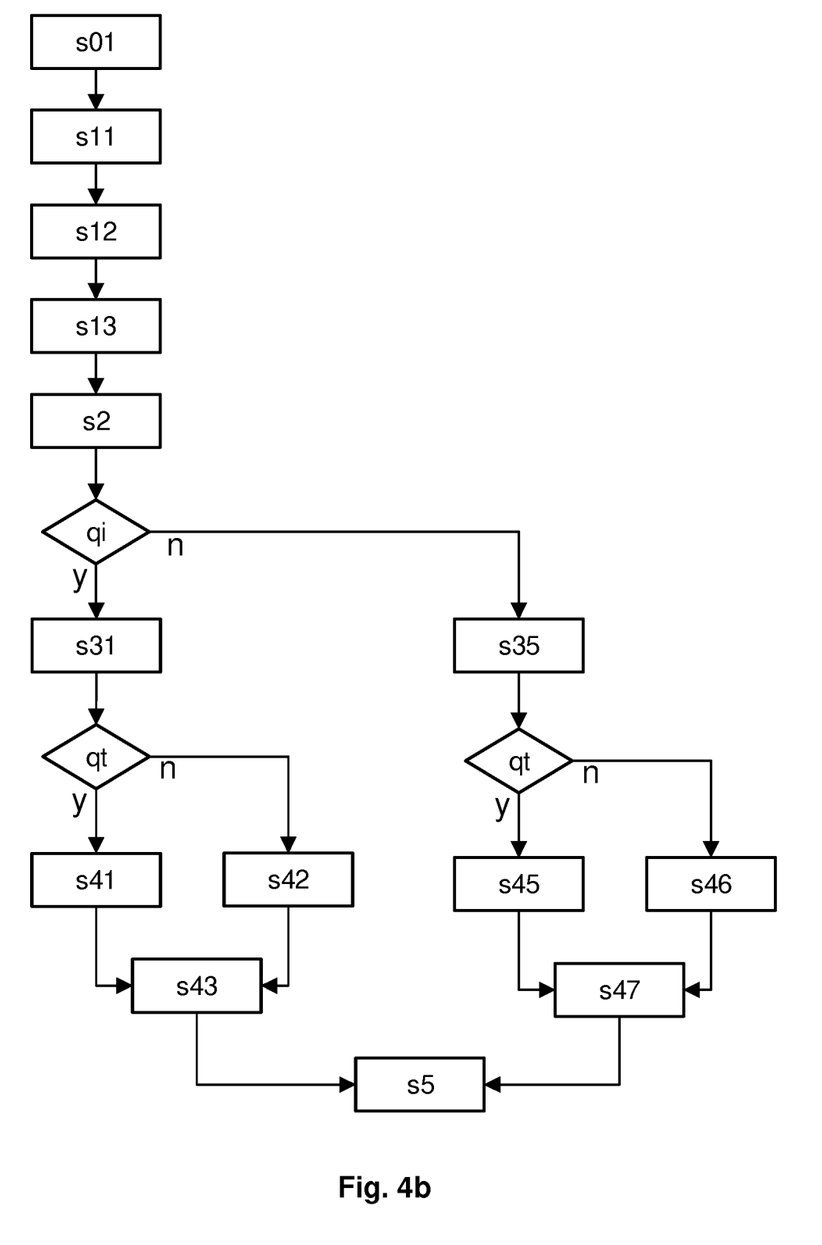
FIG. 4b shows a flowchart of a method for uniformly arranging solar cell elements according to embodiments described herein.

FIG. 4b shows a flowchart of a method for uniformly arranging solar cell elements according to embodiments described herein. Details explained with illustrative reference to FIG. 4b shall not be understood as limited to the actionactions or elements of FIG. 4b. Rather, those details may also be combined with further embodiments explained with illustrative reference to the other figures.

In the flow chart of FIG. 4b, one box represents a process actionaction, as in FIG. 4a. A rhombus represents a process branch associated with a query, each with two outgoing process branches. An outgoing process branch marked with letter y symbolizes a positive query response; an outgoing process branch marked with letter n symbolizes the alternative, negative query response.

action

Action s01 may include dividing a solar cell into two end pieces 24 with a pseudo rectangular shape and at least one rectangular intermediate solar cell element 25 by a separating process performed by a separating device 500 shown in FIG. 2.

Action s11 may include moving the solar cell elements 24, 25 at a first speed by conveying the solar cell elements 24, 25 from a conveyor belt of the separating device 500 to a conveyor belt of a transfer device 200 to enter the solar cell elements 24, 25 into the first transfer device 200, as shown in the upper half of FIG. 2.

Action s12 may include moving and aligning the end pieces 24 by a rotator 118, wherein the end pieces 24 are moved from the first transfer device 200 shown in the upper half of FIG. 2 to a second transfer device 200 shown in the lower half of FIG. 2.

Action s13 may include moving the remaining at least one solar cell element 25 by the first transfer device 200 at the first speed as shown in FIG. 3a-3d.

Action s2 may include gripping at least two solar cell elements 25 as shown in FIG. 3a.

Query qi may check whether there is exactly one solar cell element to be moved within the initial area 210? This query is equivalent to: Does the at least one solar cell element 25 to be moved include exactly one solar cell element?

Query qt may check whether there is exactly one solar cell element within the target area 310?

Action s31 may include moving the solar cell element 25 at a second speed that is higher than the first speed. Action s31 may be performed if there is exactly one solar cell element to be moved within the initial area 210.

Action s41 may include, while moving, arranging the solar cell element 25 at a predetermined lateral distance from the element within the target area 310. Action 41 may be performed if i) there is exactly one solar cell element to be moved within the initial area 210 and ii) there is exactly one solar cell element within the target area 310.

Action s42 may include while moving, arranging the solar cell element 25 at a lateral distance from the elements within the target area 310, wherein the distance essentially equals a distance between the elements within the target area 310. Action 42 may be performed if i) there is exactly one solar cell element to be moved within the initial area 210 and ii) there are at least two solar cell elements within the target area 310.

Action s43 may include placing the solar cell element 25 in the target area in the arrangement achieved in previous action s41, s42.

ActionAction s35 may include moving the at least two solar cell elements 25 at a second speed that is higher than the first speed as shown in FIG. 3b, 3c. Action s35 may be performed if there are at least two solar cell elements to be moved within the initial area 210.

Action s45 may include: while moving, arranging the at least two solar cell elements 25 at a predetermined distance to each other and at the predetermined lateral distance from the element within the target area. The arranging is performed to obtain a uniform lateral positioning of the solar cell elements. Thus, the solar cell elements are arranged side by side and laterally equidistantly spaced from each other. Action 45 may be performed if i) there are at least two solar cell elements to be moved within the initial area 210 and ii) there is exactly one solar cell element within the target area 310.

Action s46 may include: While moving, arranging the at least two solar cell elements 25 at a distance to each other, wherein the distance essentially equals a distance between the elements within the target area 310. The arranging is performed to obtain a uniform lateral positioning of the solar cell elements. Thus, the solar cell elements are arranged side by side and laterally equidistantly spaced from each other. Action 46 may be performed if i) there are at least two solar cell elements to be moved within the initial area 210 and ii) there are at least two solar cell elements within the target area 310.

Action s47 may include placing the at least two solar cell elements 25 in the target area 310 in the arrangement achieved in previous actions s45, s46, as shown in FIG. 3d.

Action s5 may include transporting the elements for further processing. The further processing may concern, for example, drying and/or stacking the solar cell elements or providing the solar cell elements with electrical connections. The further processing may also concern arranging the at least two solar cell elements which may include i) moving a first solar cell element 11 and a second solar cell element 12 from an initial area 210 of transport device 200 to a target area 310 of support device 300, and ii) aligning the first solar cell element 11 and the second solar cell element 12 to partially overlap in the target area of the support device 300, to form a solar cell arrangement, such as a shingled solar cell.

According to embodiments described herein, aligning the first solar cell elements 11,12 may include changing an orientation of at least one solar cell element from a first initial orientation in the first initial position to a first target orientation in the first target position, wherein especially the first target orientation and the second target orientation differ by less than 10°.

According to embodiments described herein, moving the first solar cell element 11 and the second solar cell may include i) gripping the first solar cell element 11 and the second solar cell element 12, ii) moving, particularly translatorily, the first solar cell element 11 and the second solar cell element 12, and iii) releasing the first solar cell element 11 and the second solar cell element 12 after the movement is stopped.

This written description uses examples to disclose the disclosure, including the best mode, and also to enable any person skilled in the art to practice the described subject-matter, including making and using any apparatus or system and performing any incorporated methods. Embodiments described herein provide an improved method and apparatus for uniformly arranging solar cell elements, and a system for use in the manufacture of solar cells, wherein an improved production speed of solar cells is achieved while maintaining high quality standards. While various specific embodiments have been disclosed in the foregoing, mutually non-exclusive features of the embodiments described above may be combined with each other. The patentable scope is defined by the claims, and other examples are intended to be within the scope of the claims if they have structural elements that do not differ from the literal language of the claims, or if they include equivalent structural elements with insubstantial differences from the literal language of the claims.

REFERENCE SIGNS 1 first direction, horizontal direction, x direction
2 second direction, vertical direction, y direction
3 third direction, horizontal direction, z direction
11 first solar cell element
12 second solar cell element
24 solar cell element formed as an end piece
25 solar cell element formed as an intermediate piece
26 intermediate pieces remaining after removing end pieces
27 end pieces with the same orientation, after performing aligning
30 uniformly arranged solar cell elements coming from intermediate pieces
31 uniformly arranged solar cell elements coming from end pieces
10 apparatus for uniformly arranging at least two solar cell elements
100 transfer device
112 gripping unit
113 gripping handle of a gripping unit
114 gripping head of a gripping unit
116 first actuator, translator
118 second actuator, rotator
200 transport device
210 initial area
222 belt of transport device
224 roller of transport device
226 rotational axis of roller of transport device
300 support device, belt conveyor of support device
310 target area
322 belt of support device
334 roller of support device
336 rotational axis of roller of support device
400 device for producing shingled cells arrangements
500 separating device

The invention claimed is:

1. Apparatus for transporting solar cell elements, comprising:
a transport device for moving a first solar cell element at a first speed from a first position to a second position;
an actuator configured to move a transfer device, the transfer device being configured to grip solar cell elements on the transport device, lift the solar cell elements off the transport device and put the solar cell elements back on the transport device; and
a cleaving station for cleaving a solar cell into two end pieces with pseudo rectangular shape and at least four rectangular intermediate solar cell elements; and
a controller configured to select a second solar cell element on the transport device whose movement shall be accelerated, the controller being configured for controlling the actuator such that the transfer device moves the second solar cell element from a third position to a fourth position at a second speed while the transport device moves at the first speed, wherein the second speed is higher than the first speed,
wherein the transfer device further comprises a rotator configured to simultaneously move the first solar cell element or the second solar cell element in a first orientation and change the rotational orientation of the first solar cell element or the second solar cell element to a second orientation opposite of the first orientation, the rotator further comprising a rotator axis and at least two laterally extended arms for moving the first solar cell element or the second solar cell element along a circular arc around the rotator axis and for changing the rotational orientation of the first solar cell element or the second solar cell element when rotating the rotator around the rotator axis wherein the second solar cell element moves at the first speed after the second solar cell element has been put back on the transport device.

2. The apparatus according to claim 1, wherein the transport device and the transfer device are configured to transport at least one solar cell element at least partly over a same transport route.

3. The apparatus according to claim 1, wherein:
the transport device is configured to move at least two solar cell elements at the first speed; and
the transfer device includes at least two gripping units configured i) to grip the at least two solar cell elements; or ii) to move the gripping units relative to each other; or iii) a combination of i) and ii).

4. The apparatus according to claim 3, wherein the apparatus is configured to place the at least two solar cell elements in a target area at a predetermined distance from each other, or to uniformly arrange the at least two solar cell elements in relation to at least one solar cell element present in the target area.

5. The apparatus according to claim 3, wherein the gripping units are configured to grip at least one solar cell element less than the solar cell elements moved by the transport device, the transport device being configured to further transport at least one solar cell element to a support device.

6. The apparatus according to claim 1, wherein the transfer device includes at least one gripping unit configured to releasably grip at least one solar cell element from the underside.

7. The apparatus according to claim 1, wherein:
the transport device is configured to move at least two solar cell elements at the first speed; and
the transfer device includes at least two gripping units configured i) to grip the at least two solar cell elements; or ii) to move the gripping units relative to each other; or iii) a combination of i) and ii).

8. The apparatus according to claim 7, wherein the apparatus is configured to place the at least two solar cell elements in a target area at a predetermined distance from each other, or to uniformly arrange the at least two solar cell elements in relation to at least one solar cell element present in the target area.

9. The apparatus according to claim 7, wherein the gripping units are configured to grip at least one solar cell element less than the solar cell elements moved by the transport device, the transport device being configured to further transport at least one solar cell element to a support device.

10. The apparatus according to claim 1, wherein the rotator comprises at least two laterally extended arms, each of which having a gripping unit for gripping a solar cell element at a distance from a rotator axis that is substantially vertical to the solar cell element gripped or grippable by the gripping unit, for moving the solar cell element along a circular arc and for changing or leaving unchanged the orientation of the solar cell element when rotating the rotator around the rotator axis.

11. System for use in the manufacture of solar cells, comprising:
the apparatus of claim 1;
a support device configured to provide a target area of the solar cell elements;
a cleaving station for cleaving a solar cell into a number of solar cell elements; and
an arranging station for arranging at least two solar cell elements to partially overlap.

12. Method for uniformly arranging solar cell elements, comprising:
moving, using a transport device, a first solar cell element from a first position to a second position at a first speed;
selecting, using a controller, a second solar cell element on the transport device whose movement shall be accelerated;
moving, using a transfer device, the second solar cell element from a third position to the fourth position at a second speed while the transport device moves at the first speed, wherein the second speed is higher than the first speed; and
wherein the transfer device further comprises a rotator configured to simultaneously move the first solar cell element or the second solar cell element in a first orientation and change the rotational orientation of the first solar cell element or the second solar cell element to a second orientation opposite of the first orientation, the rotator further comprising a rotator axis and at least two laterally extended arms for moving the first solar cell element or the second solar cell element along a circular arc around the rotator axis and for changing the rotational orientation of the first solar cell element or the second solar cell element when rotating the rotator around the rotator axis
wherein the second solar cell element moves at the first speed after the second solar cell element has been put back on the transport device
moving the second solar cell element at the first speed after the second solar cell element has been put back on the transport device by the transfer device.

13. The method according to claim 12, further comprising:
transporting at least one solar cell element at least partly over a same transport route.

14. The method according to claim 12, further comprising at least one of:
gripping at least one solar cell element in an initial area;
moving the at least one solar cell element from the initial area to a target area;
placing the at least one solar cell element in the target area; and
arranging the at least one solar cell element at a predetermined distance from a solar cell element present in the target area, or uniformly arranging the at least one solar cell element with respect to at least two solar cell elements present in the target area.

15. The method according to claim 12, further comprising at least one of:
moving at least two solar cell elements at the first speed;
gripping at least two solar cell elements moving at the first speed;
moving the at least two solar cell elements at the second speed;
placing the at least two solar cell elements in a target area at a predetermined distance from each other, or uniformly arranging the at least two solar cell elements in relation to at least one solar cell element present in the target area;
from the at least two solar cell elements moving at the first speed, gripping at least one solar cell element less than the solar cell elements moving at the first speed, moving the at least one gripped solar cell element at the second speed and further moving at least one solar cell element at the first speed.

\* \* \* \* \*